United States Patent [19]

Lassen

[11] Patent Number: 4,544,442
[45] Date of Patent: Oct. 1, 1985

[54] PROCESS FOR THE MANUFACTURE OF SUBSTRATES TO INTERCONNECT ELECTRONIC COMPONENTS

[75] Inventor: Charles L. Lassen, Cold Spring Harbor, N.Y.

[73] Assignee: Kollmorgen Technologies Corporation, Dallas, Tex.

[21] Appl. No.: 633,877

[22] Filed: Jul. 24, 1984

Related U.S. Application Data

[62] Division of Ser. No. 254,132, Apr. 14, 1981, Pat. No. 4,500,389.

[51] Int. Cl.$^4$ .................................................. B44C 1/22
[52] U.S. Cl. ..................... 156/643; 156/150; 156/155; 156/272.8; 156/668; 219/121 LJ; 219/121 LL; 427/271; 428/137
[58] Field of Search ................. 51/326; 156/150, 154, 156/155, 272.8, 278, 643, 644, 668; 174/68.5; 219/121 LF, 121 LH, 121 LJ, 121 LL, 121 LN; 427/271; 428/137

[56] References Cited

U.S. PATENT DOCUMENTS 3,607,380  9/1971  Thams .............................. 428/195 X
3,674,914  7/1972  Burr ................................ 156/166 X Primary Examiner—Robert A. Dawson
Attorney, Agent, or Firm—Morgan, Finnegan, Pine, Foley & Lee

[57] ABSTRACT

A process for making substrates for interconnecting components in which a filament is applied and affixed to a base in a pre-programmed pattern, the base surface and applied filaments are coated with a coating and the coating is hardened to form a substantially flat surface over the base and filaments. The coated base is then positioned on a table movable along "x" and "y" axes and the coated base is positioned under a high energy beam at pre-programmed points on the applied filament pattern and access openings are formed in the coating on the base at such points to expose the filament at each such point so that the exposed filament can be interfaced with the exposed surface of the coated base and articles for mounting and interconnecting components formed thereby.

14 Claims, 17 Drawing Figures

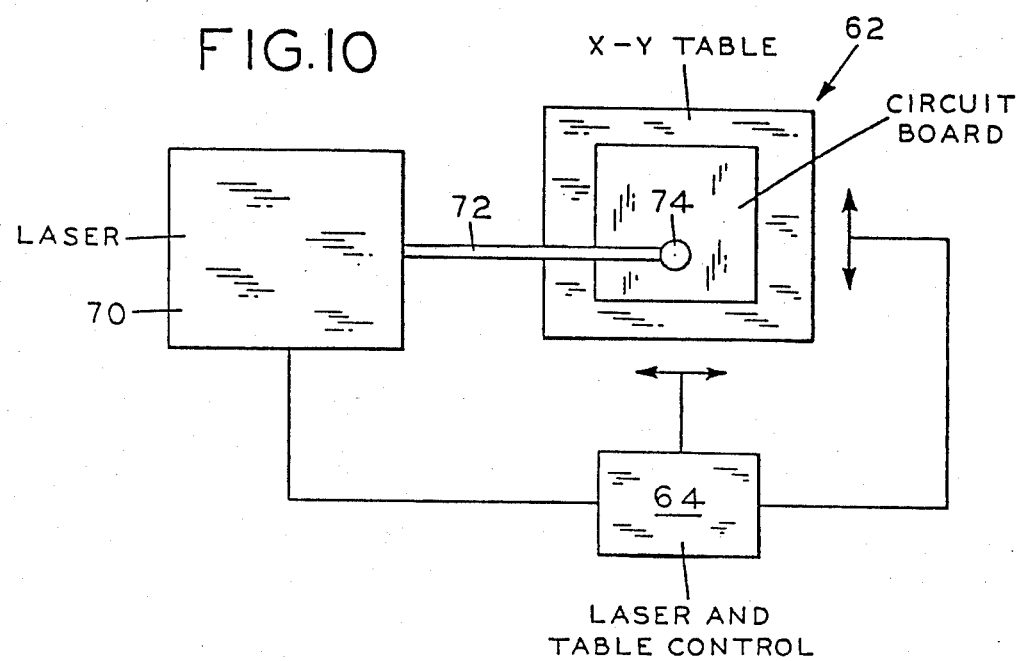
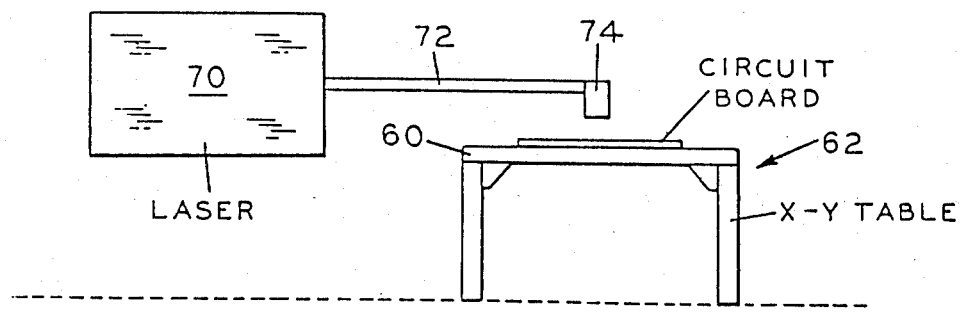

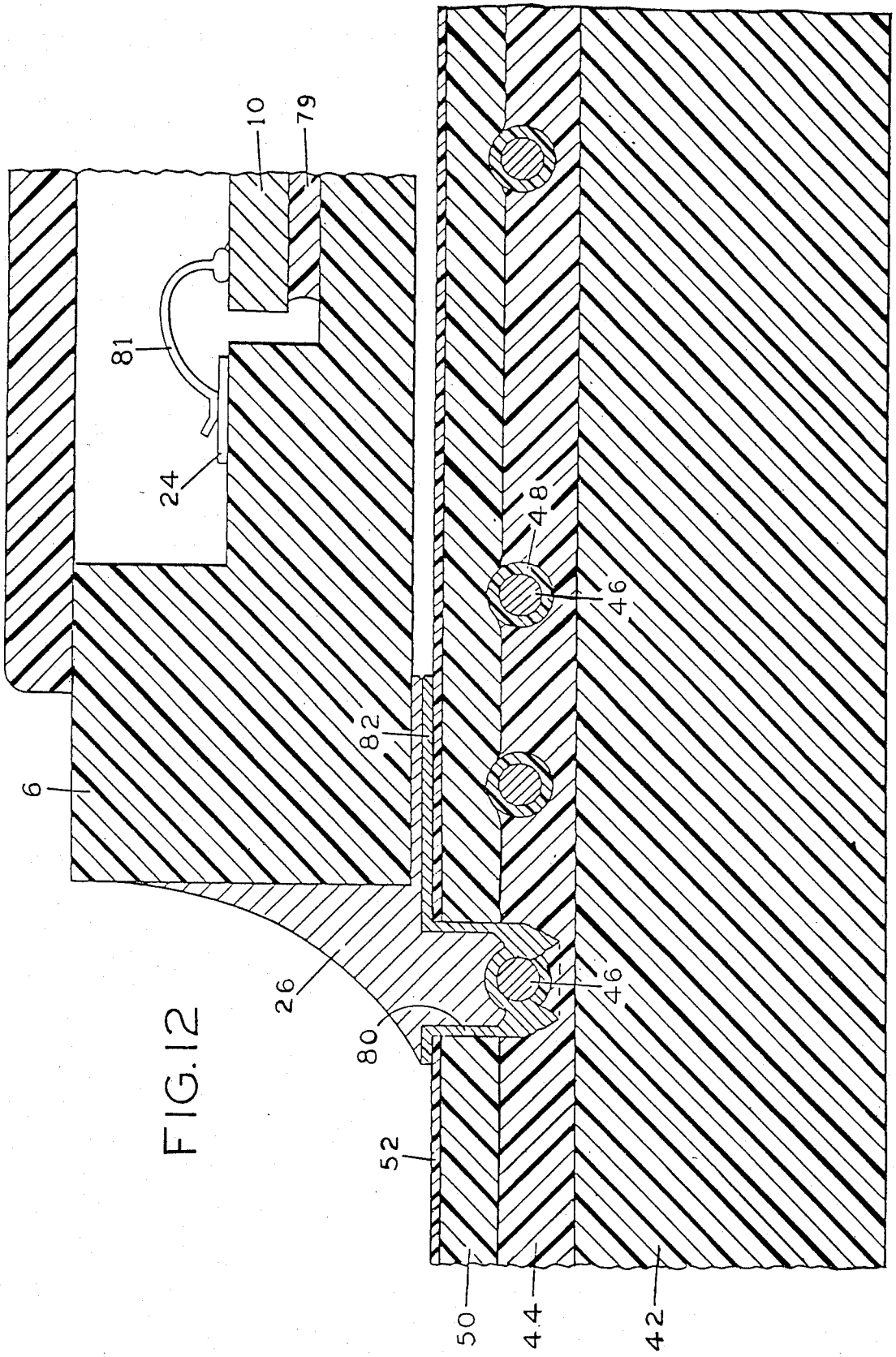

PROCESS FOR THE MANUFACTURE OF SUBSTRATES TO INTERCONNECT ELECTRONIC COMPONENTS

This is a division, of application Ser. No. 254,132 filed Apr. 14, 1981 and now U.S. Pat. No. 4,500,389.

This invention relates to substrates which include filamentary members and which support and interconnect components, a method for making such substrates, apparatus for carrying out the method and to the substrates produced thereby.

U.S. Pat. Nos. 3,674,602 and 3,674,914, both dated July 4, 1972 and U.S. application Ser. No. 9,082, filed Feb. 2, 1979, and now abandoned, disclose and describe circuit boards employing filamentary members of wire, and methods and apparatus for making such boards. In such disclosures and descriptions, a wire is scribed onto the energy actuatable surface of an insulated base or board. The wire is scribed onto the surface in a predetermined pattern with a head. The head is energized, activates the surface as the wire is brought into contact therewith and bonds the wire to the board or base surface. The movement of the board, head and wire and energizing of the head are controlled in such fashion that the wire is scribed and fixed to the board in a precise pattern. The wire is cut and subsequently drilled through to expose a surface for metallization. The cut wire and drilled hole are metallized to form a terminal hole in the board electrically interconnected by the wire. These electrically interconnected terminal holes may then receive component leads which may be attached and connected to the board, such as, by soldering. A precise, electronic package is thus formed.

The replacement of hand wiring by such electronic packaging using wire scribed and printed circuit boards has reduced the size and weight of electronic equipment. Further reductions have been achieved through the development and general availability of integrated circuits. In such integrated circuits a plurality of components performing different electronic functions are formed on a semiconductor surface which is incorporated into a microelectronic package. Such packages, commonly called dual-in-line packages, embody leads through which electrical contact may be made with the integrated circuit and which also serve to mount and connect the package to the holes in the wire scribed or printed circuit board. The leads of such dual-in-line packages are commonly spaced 100 mils apart on two parallel rows extending from the plastic or ceramic body of the package. The rows may be 400 or more mils apart and the packages may often be interconnected on low density wire scribed or printed circuit boards with conductors spaced on a 50 mil grid pattern.

Whilst the dual-in-line package with leads on 100 mil centers and boards having 50 mil grid patterns have found extensive use, the desire to reduce the size and weight of electronic equipment and to increase the number of functions per unit volume has assumed increasing importance. Foremost in this drive for more electronic functions in less space are the designers and makers of integrated circuits. One of the results of increasing the number of functions on the integrated circuit is to increase the number of leads per microelectronic package. In complex integrated circuits with many leads, the geometry of the dual-in-line package, with its two rows of leads on 100 mil centers, makes the package excessively large in relation to the size of the integrated circuit. It also degrades the electrical performance of the circuit and makes insertion and removal from the printed circuit board difficult.

New, more compact, microelectronic packages have been developed to accommodate these complex integrated circuits. One such family of packages, commonly called chip carriers, may be surface mounted rather than being connected by leads passing through the board. These packages are square and have terminals on all four edges rather than on two sides as in the dual-in-line packages. The terminals are spaced on centers of 50 mils, 40 mils or less, thus substantially reducing the area of the package as compared to the dual-in-line package. This substantially increases the number of terminals per unit area.

The reduction in package area made possible by the chip carrier, substantially increases the number of microelectronic packages which may be mounted and electrically connected by a circuit board or interconnection substrate of given area.

However, such increase in number of packages or component package density and closer terminal spacing increases the terminal density requirement on the board or substrate and the heat density of the system. This increased terminal density generates and requires higher conductor density. Contact pads, rather than through holes, are employed on the surface of the substrate to provide higher conductor density. Electrical contact between such surface pads and the substrate conductors can be made in dimensions which approach that of the conductor itself.

The instant invention is particularly adapted to meeting the high density terminal and high density conductor requirements of chip carriers and unpackaged integrated circuit chips. At the same time, the instant invention allows substrate cores to be employed which possess particular properties such as good heat dissipation, low cost or match the coefficient of thermal expansion with the chip carrier or integrated circuit materials. Solder joint failure induced by temperature stress is avoided.

In the instant invention filaments are applied or scribed onto a carrier. The filaments or the carrier might have an energizable adhesive surface for bonding the filaments to the carrier. The filaments are applied or scribed to the carrier in a predetermined pattern with apparatus such as that shown and described in the aforementioned '602 or '914 patents or '082 patent application, the disclosures of which are incorporated herein by reference. The filaments may be optical fibers or preinsulated wires, such as copper wire of about 2 to 4 mil diameter which has been found to be particularly adapted for use in the instant invention. Thus, the filaments contain at least one conductive portion, i.e., a portion which can act as a conductor, e.g., an electrical conductor, an optical conductor or the like. The conductive portion of the filaments may or may not have a dielectric coating.

The filaments are bonded to the carrier in a high density horizontal and vertical grid with grid center lines spaced about 12.5 mils apart. A layer of material is then applied, preferably in the form of liquid, over the filaments previously bonded to the carrier in a manner so as not to move or disturb the position of the filaments previously applied relative to each other or the carrier. The liquid forms a smooth, planar surface over the carrier and the filaments. Movement of the filaments might adversely affect subsequent processing and the utility of the article and, thus, is avoided. The liquid material applied should be capable of being hardened at room temperature or at low temperature; for example, below 100° C. so as to avoid temperature excursions which might also adversely disturb the position of the filaments. Preferably the material is hardened at room temperature. This may be achieved by room temperature curing agents or by ultra violet radiation curing.

The surface of the applied liquid layer may be brought into temporary close contact with and the applied liquid leveled by the surface of a material which will not adhere to the surface of the liquid layer and the hardened surface formed thereby. Such temporary close contact surface, such as shown and described in U.S. Pat. No. 3,607,380, dated Sept. 21, 1971, levels the liquid layer surface without disturbing the filaments therein. A substantially planar surface, with the filaments embedded therein, is thus formed. Leveling might also be accomplished with a doctor blade, roller or squeegee so long as the filaments are not moved or disturbed.

Where the filamentary member is a wire, the hardened, planar surface is preferably capable of adhesion promotion by chemical or mechanical means or by ion bombardment so as to form micropores or surface roughness to provide anchoring sites for the deposition of conductive material by electroless plating, vapor deposition or other appropriate methods, at a later stage of processing. This may be achieved by the inclusion of preferentially etchable materials such as rubber or polyethersulfone, in the surface of the hardened, planar coating.

Additional level or levels of filament grids may be added.

The carrier to which the filaments have been affixed and the planar material applied and hardened is attached to a table movable in a controlled pattern along 'X' and 'Y' axes so as to locate preprogrammed points on the carrier under a high energy beam, such as a coherent laser. The beam is directed perpendicular to the table and to the carrier mounted thereon. Alternatively, the carrier may be fixed and the beam moved in 'X' and 'Y' axes. The location of the filaments in the hardened, planar material may be targeted optically so as to substantially eliminate location errors. The carrier is moved relative to the high energy beam so that the desired filament is in line with the beam at a predetermined point. The filament is then exposed by the beam at such point. Preferably, if the filament is metallic, a high energy beam, such as a $CO_2$ laser is used. When the beam is aligned with the desired predetermined point on the filament, the beam is pulsed or modulated to direct energy at the filament so as to vaporize and remove the hardened material and the filament insulation, leaving a precisely formed cavity with the filament substantially exposed. This is achieved with a $CO_2$ laser using the contrast between the reflective power of the metallic filament to $CO_2$ laser light and the absorbative power of the largely organic insulation and hardened surface coating material applied and hardened over the filaments on the carrier.

In addition to a high energy beam, such as a $CO_2$ laser, the hardened material and wire insulation mightbe removed with other suitable lasers or controlled depth mechanical drills, by a modulated stream of abrasive particles, a water jet or stream of chemicals or solvents. In any event, cavities of precise size, not substantially larger than the filament and no larger than that required to interface the filament with the surface should be formed. The hardened, planar material and insulation is removed leaving the filament substantially intact and exposed, so that its conductive characteristics are not impaired. With a wire filament size of 2 to 4 mils, the diameter of the cavity would be between 6 and 12 mils.

When all the predetermined filament points have been exposed and filament access cavities have been formed, the circuit might be finished in conventional manner. Where the filaments are metal wires, this is accomplished by adhesion promotion of the surface followed by sensitizing the cavities, exposed filaments and surface such as with a catalyst and electrolessly depositing metal, for example, copper. This may be carried out selectively to form surface features or metal may be deposited over the whole surface and features formed by subsequent masking and etching. Additional thickness of metal may be built up by electroplating and surface features formed by conventional semi-additive means.

During the plating operation metal is deposited on the walls of the cavities and on the surface and makes intimate contact with the exposed surface of the filament to interface the filament with the external surface. Metal may also be deposited in cavities which do no interface with filaments, but interface with other conductive features, such as pads, or power and ground planes, at other levels in the circuit. Alternatively, means other than plating may be used to interface the filament or other conductive feature to the external surface. Such means might include sputtering of metal, metal spraying, conductive polymeric pastes, solder pastes and conventional solder. In the case where the filament is not a metal wire, means appropriate and compatible with the filament conductor may be used to interface the filament to the external surface. For example, an optoelectronic means might be employed to interface optical filaments with electronic components.

In the instant invention, the high density interconnection circuit may be formed and processed on a carrier which will form an integral part of the article or may be formed, processed and then removed from the carrier. Where the carrier is to remain as an integral part of the article processed and formed, the carrier should, of course, be of a material suitable for the article and dimensionally stable for the process.

Where, for example, the article to be formed is to include metal filaments and a metal base, a dielectric film or coating would first be applied to the metal base. Such film or coating may include isolated metal pads at the points where cavities are to be formed to deflect the high energy beam and avoid short circuiting to the metal base.

Where the formed circuit after processing is to be removed from the carrier and the carrier reused, the circuit is formed, built up and processed on the carrier and then peeled off and removed. The formed circuit, pealed from the carrier might then be laminated to a base or formed circuits might be built up or laminated one over the other to form a multi-level circuit Where, for example, metal filaments are to be employed, and the article, formed and processed, is to be removed from the carrier, the carrier may be of stainless steel plated with lightly adherent copper. Other lightly adherent combinations of carrier and plating might be employed. The article is built up and processed on the carrier and, with the plating, is peeled from the carrier. After removal from the carrier the plating on the article may be used in the formation of conductive features by conventional processes.

The high conductor density which is achievable with the filament grid geometry of about 12½ mils and more particularly with the small diameter of the filament access cavities of the instant invention, enables complex interconnect patterns to be executed with a minimum of levels. The circuit may therefore be manufactured with a thickness of about 10 to 20 mils.

The thinness of the circuit thus formed or laminated to a base allows the components to be positioned in close proximity to that base. This allows properties of the base such as coefficient of thermal expansion and heat dissipation to be imparted to the components more readily than in the instance of thicker, lower density, multiple level circuits. The problems of heat and heat dissipation are alleviated.

The present invention will be more fully described and will be better understood from the following description of preferred embodiments of the invention taken with the appended drawings in which:

FIG. 10 is a schematic plan view of an apparatus for carrying out part of the process and for producing the cavities of the instant invention;

FIG. 11 is a side view, in elevation, of the schematic apparatus of FIG. 10;

FIG. 12 is a sectional view of the interconnection substrate of the instant invention showing the interconnection between the conductor or wire, a chip carrier and chip;

Figure 1:
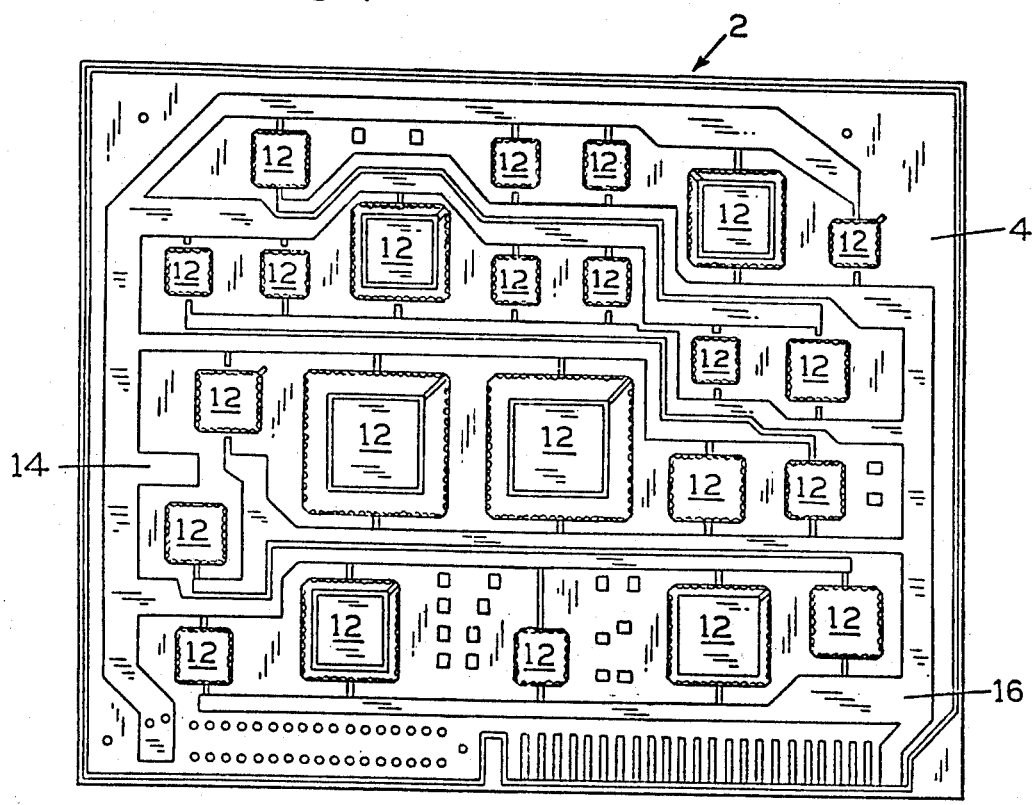
FIG. 1 is a top plan view of an interconnection substrate of the present invention.

Referring to the drawings, particularly FIG. 1, the circuit generally designated 2, includes the interconnection substrate 4 having mounted thereon chip carrier, chip and cover assemblies 12. Chip carriers 12 are connected to surface pads and may be connected to power and ground bus bars 14, 16, formed on the surface of substrate 4.

Figure 2:
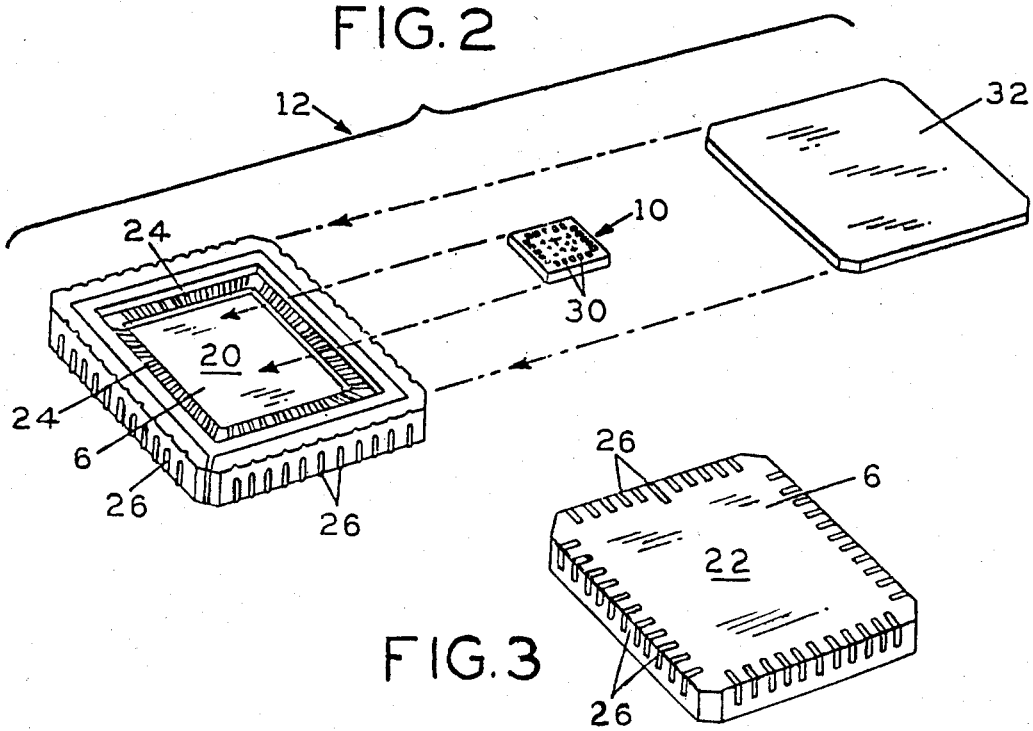
FIG. 2 is an exploded view, in perspective, of a chip carrier, chip, and cover, to which the invention is particularly adapted.
Figure 3:
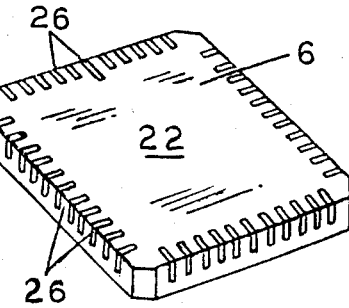
FIG. 3 is perspective view of the chip carrier of FIG. 2 when viewed from the bottom.

Chip carriers 12 vary in size, depending upon the complexity and size of the chip carried therein. As best shown in FIG. 2, chip carriers 12 is made up of a body 6, having a recessed center top portion 20 and a flat bottom portion 22, FIG. 3. For purposes more apparent later herein, recessed center top portion 20 has a plurality of contacts 24 spaced therearound Bottom 22 and the sides of body 6 are provided with a plurality of contacts 26 spaced around the carrier sides and extending onto bottom surface 22, FIG. 3. Chip 10, FIG. 2, has a plurality of contacts 30 extending around the top edge of the chip.

Chip 10 is assembled in recess 20 of body 6 with contact 30 of chip 10 connected to contacts 24 in recess 20 of body 6. With chip 10 in recess 20 and contacts 30 and 24 connected, cover 32, FIG. 2, is placed over recess 20, covering the recess and the chip 10 therein. As will be later described, contacts 26 of body 6 to be connected to the circuit 2 are mounted on and soldered to contact pads on the substrate after the circuit is fabricated and the desired contact pads are formed thereon. As will also be described later herein, contacts 30 in chip 10 may be connected, by soldering, wire bonding or other appropriate means, directly to the contact pads on the substrate, once such contact pads are formed, and carrier body 6 with cover 32 are not used.

Referring next, to FIGS. 4–9, in this illustrated embodiment, base 42, which may be plastic, glass fiber reinforced plastic, ceramic or coated metal is coated with an adhesive 44 activatable by ultrasonic energy. Metal wire 46 coated with an insulating coating 48 is scribed onto and embedded in adhesive 44 in accordance with the teachings and disclosures of the aforementioned '602 and '914 patents and the '082 application the disclosures of which, as already noted, are incorporated herein by reference. The substrate, with the wire scribed thereon in the pre/programmed pattern, may be heated and baked to further cure the adhesive in which the scribed wire is embedded and to remove and drive off volatiles from the adhesive. A liquid material 50 is then cast over the scribed wires. The exposed surface of the liquid 50 is brought into contact with the surface of a film, such as a polyester, which will not adhere to the coating, the coating is cured or hardened at a temperature below 100° C. and the non-adherent film is removed. Such a procedure is disclosed and described in the aforementioned '380 U.S. patent, the disclosure of which is incorporated herein by reference. The exposed surface of the liquid 50 might also be spread and leveled with a knife, doctor blade or roller or might be flowed, ponded or puddled onto the wire scribed board before the material 50 is cured or hardened. In any event, a smooth, flat, planar surface is thus provided on the substrate. The dried and cured coating forms layer 50 over the wire scribed board. A thin adhesive coating 52, such as epoxy rubber, may be applied over layer 50 and dried or cured so as to form a coating over the board for adhering the metal subsequently amplied by printing, plating or the like.

Figure 4:
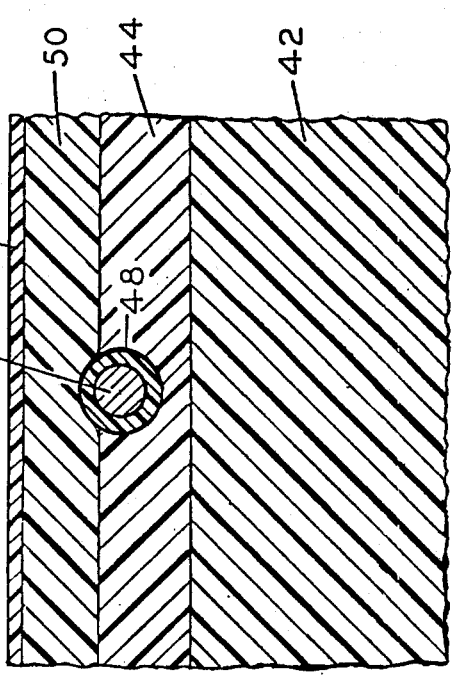
FIG. 4 is a sectional view through a section of an interconnection substrate showing the preinsulated conductor before high energy, ablation of the coating and insulation.
Figure 5:
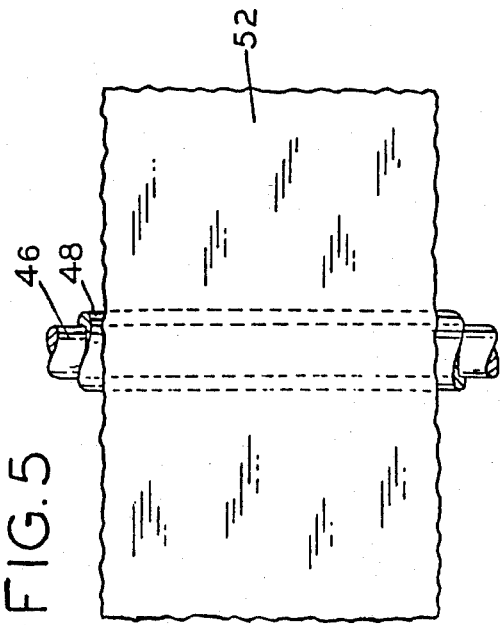
FIG. 5 is a top plan view of the section of FIG. 4.

Referring, next, to FIGS. 10 and 11, the wire scribed and adhesive coated substrate of FIG. 4 is mounted on and registered with table 60 of 'X'- 'Y' table machine, generally designated 62, numerically controlled, such as with a floppy disc computer controller 64, and preprogrammed to move table 60 and the substrate attached thereto through a preset sequence. A high energy source, capable of being focused and applied as a vertical beams to the substrate on the table, such as laser 70, is projected as a laser beam through tube 72 and is applied vertically such as through a mirror and mirror head 74. An Everlase 150 Watt $CO_2$ laser manufactured by Coherent Inc., has been found to be particularly adaptable as a high energy laser source for use in the instant invention. Computer drive 64 not only controls the movement and stopping of 'X'- 'Y' table 62 but also controls the pulsing of laser 70. Thus, as table 60 and the scribed substrate mounted thereon is moved from point-to-point and then stopped by control 64, at each stop laser 70 is pulsed.

Figure 6:
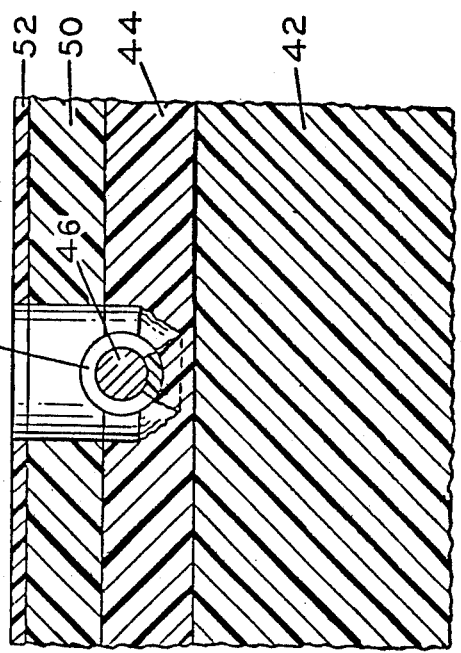
FIG. 6 is a sectional view similar to FIG. 4 but showing the exposed conductor after formation of the interfacing cavit.
Figure 7:
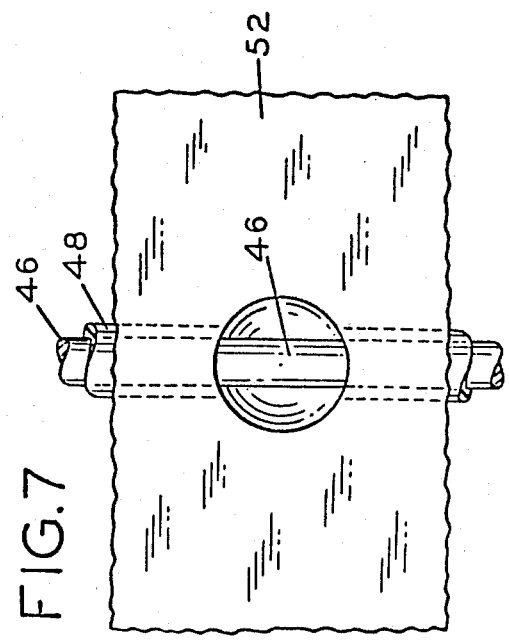
FIG. 7 is a top plan view of the section of FIG. 6.

As best shown in FIGS. 6 and 7, with the wire scribed and rubber epoxy coated substrate of FIG. 4 mounted on table 60, table 60 and computer drive 64 are preprogrammed so as to align conductor 46 with the beam from mirror head 74. When the conductor 46 is so aligned, table 60 and the substrate mounted thereon is stopped and the high energy source is pulsed. The high energy source, in the described embodiment a laser, may be pulsed once during each stop or a series of pulses might be applied. The power of the energy source is adjusted so as to apply the energy to the substrate at the desired absorption level. In any event, the rubber epoxy coating and the coating over the conductor are heated, vaporized and flashed off. Insulation 48 is exposed to the beam and with the coating is vaporized and flashed off. The metal in the conductor or wire 46, which in the preferred embodiment is copper, reflects the energy beam and remains intact. Thus, as best shown in FIGS. 6 and 7, a substantially cylindrical cavity is formed from the surface into the substrate leaving the conductor or wire in the opening partially bare and exposed.

After the preprogrammed pattern of cavities or openings in the board surface has been completed, the hole walls, rubber epoxycoated surface and exposed wire are metal plated. This may be accomplished by electroless plating or with a combination of electroless and electroplating, the cavity and outer epoxy rubber surface being first sensitized with a catalyst applied after high energy formation of the cavity or incorporated during initial casting and coating application. The catalyst sensitized surface is first electrolessly plated to form a thin coating of metal or the surface is first electrolessly plated to form a thin coating of metal on the surface along the cavity walls and around the exposed wire and then the electroless metal deposition might be built up in thickness by electroplating or further electroless plating.

Figure 13:
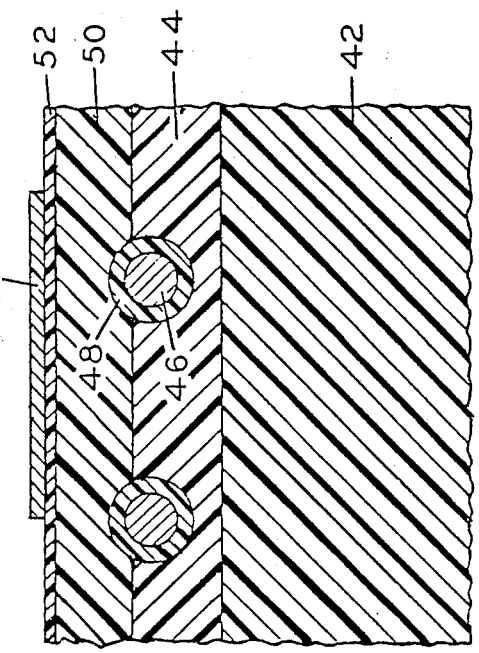
FIG. 13 is a sectional view of the interconnection substrate of one embodiment of the instant invention showing the circuit with a metal base and surface conductor.
Figure 14:
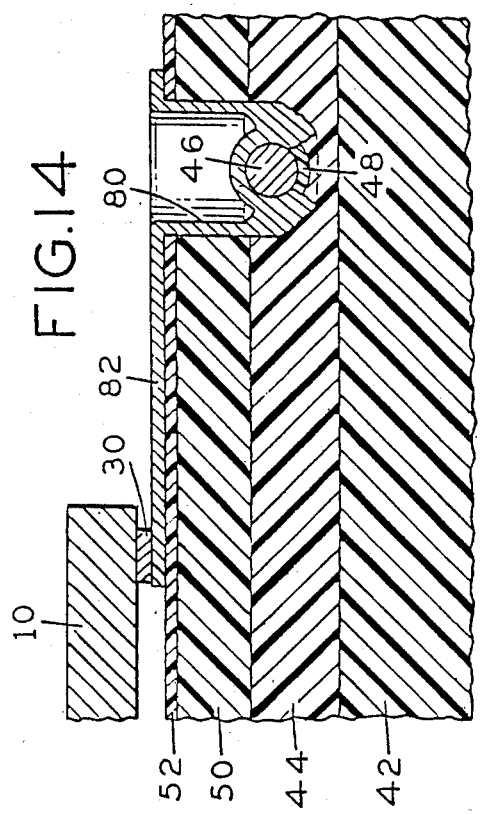
FIG. 14 is a view similar to FIG. 12 but showing interconnection between the conductor or wire and a chip and without the chip carrier.
Figure 8:
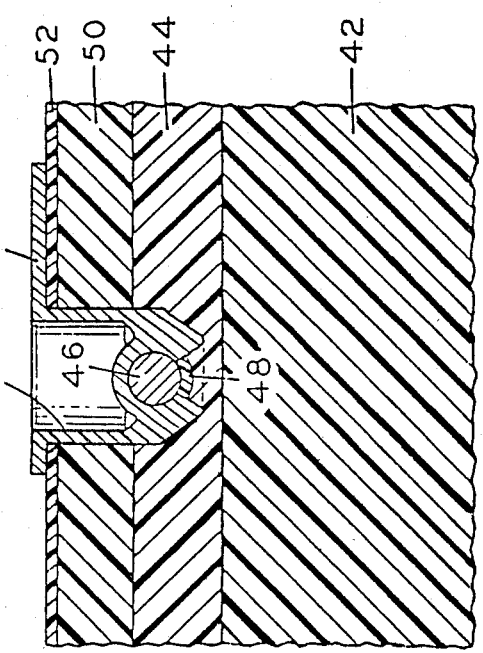
FIG. 8 is a sectional view similar to FIGS. 4 and 6 but showing the conductor and conductor pad after plating.
Figure 9:
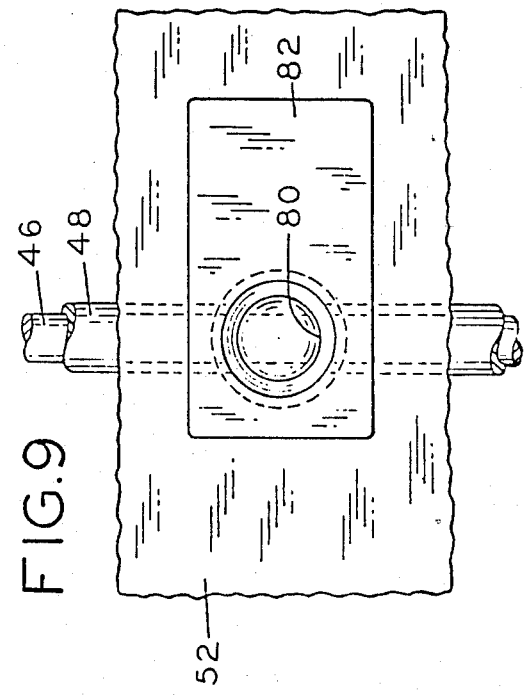
FIG. 9 is a top plan view of the section of FIG. 8.

After the substrate and cavities have been plated, conductor pads, and ground and power planes or conductors might be formed on the surface by masking and etching in any of the manners conventionally followed in preparing circuit board surfaces. Thus, as best shown in FIGS. 8 and 9, the walls of the conductor cavities are coated at 80 with metal, such as copper, and conductor pads 82 and planes 84, FIG. 13, are formed on the board surface. As best shown in FIG. 12, chip carrier 12 is electrically connected at carrier contact 26 by solder joint with conductor pad 82. As best shown in FIG. 12, chip 10 might be mounted and cemented by cement 79 and directly connected to conductor pad 82 by solder Joint 81, wire bonding or other appropriate means to chip conductor 30 in which case carrier 12 would not be used.

Figure 16:
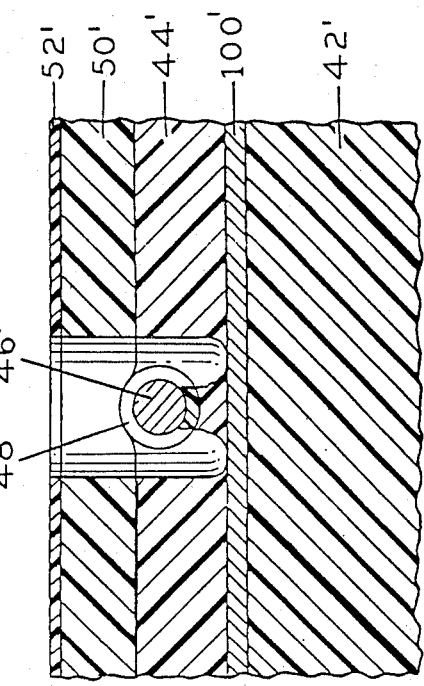
FIG. 16 is a view similar to FIG. 15 but showing the exposed conductor after formation of the cavity.
Figure 15:
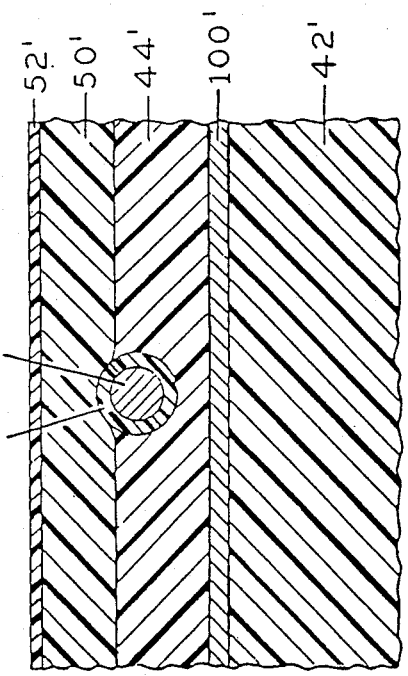
FIG. 15 is a view similar to FIG. 4 but showing the embodiment in which the circuit, when completed, is to be removed from the metal base.
Figure 17:
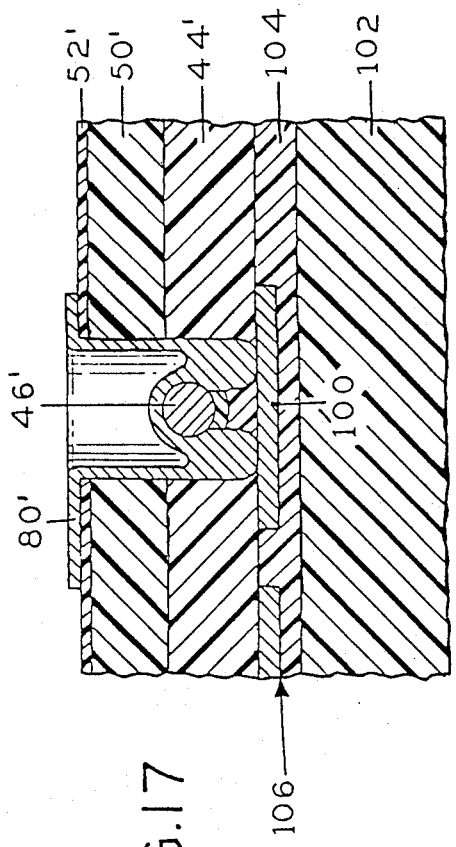
FIG. 17 is a view similar to FIGS. 15 and 16 but showing the conductor and conductor pad after plating, with the processing metal base removed and the circuit bonded to permanent base.

The embodiment of the invention illustrated in FIGS. 15, 16, and 17, is similar to the embodiment already described and is formed in substantially the same manner. Where the two embodiments differ is that, while the embodiment already described produces a substrate with an integral base used for stability during processing and as a part of the final product, the embodiment of FIGS. 15, 16, and 17 utilizes a base for processing only. Thus, metal base 42 is copper plated with plating 100. Adhesive 44' is adhered to copper plating 100, wires 48' are applied or scribed and coatings 50', 52' are applied in the same manner as in the aforedescribed embodiment.

When the cavities are subsequently filled with metal, as best shown in FIG. 17, metal to metal contact is not only provided between the hole filling metal 80' and exposed wire 48' but may also be provided with copper plating 100. Thus, when metal base 42' is removed, as shown in FIG. 17, the exposed surface of plating 100 may be masked and etched to form isolated conductor pads and power or ground distribution busses. The circuit is mounted on base 102, FIG. 17, which may be of metal or any other support material coated with an adhesive 104 which, in the case of a metal base, should also be dielectric.

In both embodiments of the invention, the dielectric base is mounted on and affixed to a rigid stable base while the wire is scribed, the liquid coating is applied, leveled, smoothened, flattened and cured in accordance with the teachings of the '380 U.S. patent, the cavities in the circuit to expose the wires or conductors are formed by high energy beams and the holes are electrolessly plated or electroplated. In the instance of the embodiment of FIGS. 4–9, the base is permanently affixed and remains a part of the finished circuit. In the embodiment of FIGS. 15–17, the metal base upon which the circuit is mounted and affixed for processing is removed, the processed circuit, with the high energy formed cavities filled with electroless or electroplated metal is bonded to a base, which may be a dielectrically coated metal base or base of dielectric material or some other dielectrically coated material. A plurality of processed circuits, each affixed to and mounted on a metal base for process and subsequently removed therefrom, might be laminated and connected, one on the other, and before or after laminating, might be mounted and affixed to a dielectric base or a dielectric coated base.

In both embodiments of the invention, the conductor or wire extends through the high energy formed cavity at the time of plating. This provides better electrical contact and mechanical strength between the conductor and cavity plating metal than could be provided when attempting to drill through a 2 to 4 mil diameter wire with a 6–12 mil diameter drill.

In the practice of the instant invention, coating 50, 50' may be cast, in situ, over the wire scribed circuit. Voids between the coating and the wire scribed circuit surface may be removed with a doctor blade or roller applied to the exposed surface of coating 50, 50'. Rather than casting coating 50, 50' in situ, the coating material may be a low temperature thermosetting or ultra-violet curing material, such as an epoxy, a polyamide or an acrylic, and may be cast on the surface between the surface and a pre-formed sheet and applied over the wire scribed circuit with a doctor blade, roller or platen to level the coating between the sheet and wire scribed circuit. In any event, coating 50, 50' forms a planar surface over the irregular wire scribed circuit and is cured or hardened before cavities are formed in the circuit. Coating 50, 50' should be of a material or contain an additive so that the coating can be cured or hardened at low temperature or by low temperature radiation, such as ultraviolet radiation. A coating process such as disclosed and described in the aforementioned '380 U.S. patent, is satisfactory. Additional planar coatings may, of course, be added to the circuit or the desired characteristics of these coatings, such as adhesion may be incorporated in coating 50, 50'.

Circuits produced in accordance with the instant invention, particularly the embodiment of FIGS. 15–17, may be laminated, one over the other. In carrying out such lamination, dielectric coating or adhesives should be used between the circuits to maintain circuit integrity.

In the practice of the instant invention cavity forming with a high energy beam, such as a laser, has been found to be particularly useful. However, as already noted, other means, such as a drill bit, abrasive, chemical or high speed jet might also be employed. Other high energy beams absorbable by the material being drilled, but not the conductor or wire, and capable of volatilizing the material and insulation on the conductor or wire, may be employed.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claims.

What is claimed:

1. A process for making circuits, the steps comprising:
   (a) bonding a substrate to a support base;
   (b) coating the exposed surface of the substrate with an energy activatable adhesive;
   (c) applying and affixing to said coated surface in a pre-programmed circuit pattern to a base, a preinsulated conductor;
   (d) applying to said coated surface and said conductor affixed thereto a coating for the purpose of maintaining the position of the filament and for providing a surface suitable for mounting surface-mounted components;
   (e) without disturbing said affixed conductor leveling said coating over said surface and said conductor to form a substantially smooth, flat, planar surface;
   (f) curing and hardening said coating;
   (g) affixing the substrate with said cured and hardened coating and said insulated conductor therein on a table;
   (h) aligning said table and said substrate affixed thereto with a high energy beam source so as to align a predetermined point on the conductor affixed to said substrate with said high energy beam source; and
   (i) with said high energy beam source and said predetermined point so aligned, energizing said high energy beam source and with the beam of said beam source volatilizing the coating on said substrate at the area in alignment with said beam and exposing said aligned circuit conductor while maintaining the integrity of said conductor.

2. A process, as recited in claim 1, in which said conductor is lacquer insulation coated and said energized beam volatilizes said substrate coating and said lacquer insulation in the area aligned with said beam source to expose said aligned conductor.

3. A process, as recited in claim 1, in which said table and said substrate are aligned with said high energy beam source at a second predetermined point in said circuit pattern after the circuit conductor aligned at said first predetermined point has been exposed and with said substrate so aligned with said second point energizing said high energy beam source, volatilizing said substrate coating and said lacquer insulation in the area aligned with said beam source and exposing said conductor in said second aligned area.

4. A process, as recited in claim 2, in which said table and said substrate are moved to a second point to align said conductor at a second predetermined point in said circuit pattern with said high energy beam source after the conductor aligned at said first predetermined point has been exposed and with said substrate so aligned with said second point energizing said high energy beam source, volatilizing said substrate coating and said lacquer insulation in the area aligned with said beam source and exposing said conductor in said second aligned area.

5. A process, as recited in claim 3, in which said steps are repeated until all conductors in said substrate, which require interfacing to the external surface, have been accessed.

6. A process, as recited in claim 4, in which said steps are repeated until all conductors in said substrate, which require interfacing to the external surface, have been accessed.

7. A process, as recited in each of claims 1 to 6, in which said high energy beam source is a laser.

8. A process, as recited in each of claims 1 to 6, in which said high energy beam source is a $CO_2$ laser.

9. A process, as recited in each of claims 1 to 6, in which said high energy beam source is a laser and said laser is pulsed while said table and said substrate are registered in line with the beam at the circuit conductor point to be exposed.

10. A process, as recited in each of claims 1 to 6, in which said high energy is a laser and said cavities formed in said substrate with said laser beam are metal plated.

11. A process, as recited in each of claims 1 to 6, in which said high energy beam is a $CO_2$ laser and said cavities formed in said circuit board with said laser beam are metal plated.

12. A process, as recited in each of claims 1 to 6, further including the step of forming said base by applying and bonding an adhesive and dielectric layer to the surface of a plated metal carrier plate.

13. A process, as recited in claims 1 to 6, in which said cavities formed in said circuit board with said beam are metal plated, said substrate with said metal plate holes is removed from said metal carrier plate and said removed substrate is adhesively bonded to an insulating base.

14. A process, as recited in claim 12, in which said holes drilled in said substrate with said beam are metal plated, said substrate with said metal plated holes is removed from said metal carrier plate and said removed substrate is adhesively bonded to an insulated metal base.

* * * * *